United States Patent [19]

Eidson

[11] Patent Number: 5,293,374
[45] Date of Patent: Mar. 8, 1994

[54] MEASUREMENT SYSTEM CONTROL USING REAL-TIME CLOCKS AND DATA BUFFERS

[75] Inventor: John C. Eidson, Palo Alto, Calif.

[73] Assignee: Hewlett-Packard Company, Palo Alto, Calif.

[21] Appl. No.: 887,591

[22] Filed: May 20, 1992

Related U.S. Application Data

[63] Continuation of Ser. No. 675,029, Mar. 25, 1991, abandoned, which is a continuation of Ser. No. 331,419, Mar. 29, 1989, abandoned.

[51] Int. Cl.$^5$ .............................................. G06F 15/20
[52] U.S. Cl. ..................................... 364/579; 364/580; 324/73.1; 340/825.2
[58] Field of Search ................... 364/550, 551.01, 569, 364/579, 580; 324/158 R, 73.1; 340/825.14, 815.20, 825.17, 870.08, 309.15, 318; 371/15.1, 16.1, 29.1; 379/255, 116; 375/20, 107, 117; 455/51, 67; 360/5; 328/363

[56] References Cited

U.S. PATENT DOCUMENTS

| 3,308,387 | 3/1967 | Hackett | 328/363 |
| 3,733,587 | 5/1973 | Lloyd et al. | 364/DIG. 1 |
| 3,864,731 | 2/1975 | Callahan | 360/5 |
| 3,885,090 | 5/1975 | Rosenbaum | 360/5 |
| 4,397,021 | 8/1983 | Lloyd et al. | 371/15.1 |
| 4,399,502 | 8/1983 | MacDonald et al. | 364/579 X |
| 4,400,783 | 8/1983 | Locke, Jr. et al. | 364/900 |
| 4,402,055 | 8/1983 | Lloyd et al. | 371/15.1 X |
| 4,517,661 | 5/1985 | Graf et al. | 364/DIG. 2 |
| 4,530,091 | 7/1985 | Crockett | 370/103 X |
| 4,581,738 | 4/1986 | Miller et al. | 371/16.1 X |
| 4,584,651 | 4/1986 | Carey, Jr. et al. | 364/569 X |
| 4,590,550 | 5/1986 | Eilert et al. | 371/16.1 X |

(List continued on next page.)

FOREIGN PATENT DOCUMENTS 0296884 12/1988 European Pat. Off. ...... G01R 31/28

OTHER PUBLICATIONS

Bisset; "LSI Tester Gets Microprocessors to generate their own test Patterns"; Electronics May 25, 1978.
Patent Abstracts of Japan, vol. 7, No. 78 (P-188) [1223], Mar. 32, 1983; & JP-A-58 9077 (Tokyo Shibauradenki K.K.) Jan. 19, 1983.
Electricaldesign News, vol. 28, No. 9, Apr. 1983, pp. 191-195, Boston, Mass. US; S. Den Beste: "Crack Tough System Problems with a Dual-Timebase Analyzer".

Primary Examiner—Jack B. Harvey
Assistant Examiner—Ellis B. Ramirez

[57] ABSTRACT

A method and apparatus for regulating a measurement system. The apparatus includes a coordinator that transmits instruction signals based upon a program stored in a memory to an instrument through a communication bus. The instrument is also coupled to a device under test. A real-time synchronized clock and a data buffer are placed on each instrument that performs a measurement, provides a stimulus, controls a device, manages data, or performs a test. Signals passing between the device under test and the instrument are processed by function circuitry. After the measurement is made and a parameter or an output signal from the device under test is collected by the instrument, the real-time clock supplies a reference time signal which is associated with each parameter or group of data derived from the device under test. The data buffer stores each group of data with its associated reference time signal until the coordinator calls for the instrument to dispatch the results of the measurement or stimulus back along the communication bus in the form of an instrument output signal. If the instrument provides a stimulus to the device under test, the stimulus appears as an input signal in accordance with the instruction signal which has been stored in data buffer. The stimulus is triggered by a timing signal from the real-time clock.

5 Claims, 2 Drawing Sheets

U.S. PATENT DOCUMENTS

| | | | |
|---|---|---|---|
| 4,627,055 | 12/1986 | Mori et al. | 371/16.1 |
| 4,628,443 | 12/1986 | Rickard et al. | 364/551.01 X |
| 4,630,224 | 12/1986 | Sollman | 364/579 X |
| 4,633,421 | 12/1986 | Watson, Jr. et al. | 364/579 |
| 4,646,299 | 2/1987 | Shinabeck et al. | 364/579 |
| 4,686,627 | 8/1987 | Donovan et al. | 324/73.1 |
| 4,696,019 | 9/1987 | Tulpule et al. | 375/107 |
| 4,703,325 | 10/1987 | Chamberlin et al. | 364/551.01 X |
| 4,709,347 | 11/1987 | Kirk | 340/825.5 X |
| 4,799,220 | 1/1989 | Nielsen | 371/25.1 |
| 4,801,870 | 1/1989 | Eichelberger et al. | 371/22.4 X |
| 4,806,929 | 2/1989 | Nishijima et al. | 340/825.06 |
| 4,819,235 | 4/1989 | Kelly et al. | 371/29.1 |
| 4,831,558 | 5/1989 | Shoup et al. | 340/825.08 X |
| 4,843,557 | 6/1989 | Ina et al. | 371/16.1 X |
| 4,882,739 | 11/1989 | Potash et al. | 369/569 |
| 4,890,303 | 12/1989 | Bader | 375/107 |
| 4,893,318 | 1/1990 | Potash et al. | 364/569 X |
| 4,894,846 | 1/1990 | Fine | 375/107 |
| 4,918,652 | 4/1990 | Bennington et al. | 364/900 |
| 4,939,753 | 7/1990 | Olson | 340/825.14 X |
| 4,945,486 | 7/1990 | Nitschke et al. | 340/825.06 |

MEASUREMENT SYSTEM CONTROL USING REAL-TIME CLOCKS AND DATA BUFFERS

CROSS REFERENCE TO RELATED APPLICATION

This is a continuation of copending application Ser. No. 07/675,029 filed on Mar. 25, 1991, now abandoned which is a continuation of application Ser. No. 07/331,419 filed on Mar. 29, 1989, now abandoned.

BACKGROUND OF THE INVENTION

The present invention relates generally to electronic measurement systems, and more particularly, to a method and apparatus for controlling automatic measurement systems using real-time clocks and data buffers. Unlike conventional devices which rely upon a central computer to issue complex interrupts and messages that command an instrument to gather and dispatch data to and from a device under test, the present invention utilizes a real-time clock and a data buffer to manage the process autonomously and simplify the entire measurement operation. Measurement system control using real-time clocks and data buffers provides an accurate, reliable, and cost effective method that can be used to coordinate the operation of a wide variety of diagnostic, stimulus, and monitoring instruments.

Complex instruments often require complicated coordination instructions from a central computer. When, for example, integrated circuits are fabricated in a chemical vapor deposition chamber, the temperature, pressure, and gaseous contents of the interior of the chamber are usually carefully regulated and monitored by a computer. This computer uses a program of instructions that contains many lines of software code to command actuators and valves to supply reactants to the chamber on a precise schedule.

The software code that is typically employed to provide the timing control for one or more instruments that gather data from or provide data to a device under test is generally tedious to compose, susceptible to errors, and often difficult to decipher by persons other than the author. The code is usually written in a simple programming language such as BASIC.

One problem created by using a central computer to manage the operation of one or many instruments via software utilizing interrupts or messages is the difficulty of making changes or improvements. Each time a new or different measurement or procedure is added, a voluminous listing of software instructions must be reviewed, rewritten, and re-entered into the memory of the central computer. Some additions or revisions may not be permitted by the constraints attributable to the hardware, network facility, or operating system that runs the applications programs on the computer. Other difficulties such as timing incompatibilities are encountered when the computer is modified or upgraded. If additional instruments are added to the system to make more measurements, the enlargement of the network can cause propagation delays that impair communications throughout the system. Another shortcoming of utilizing a central computer to handle all aspects of the operation of several instruments is the loss or confusion of output data. Once the computer has commanded the various instruments to collect information about an object or a device under test and the resulting instrument output signals are reported back to the central computer in accordance with its instructions, some data may arrive out of order or may be missing, and therefore ruin the measurements. Perhaps the greatest deficiency of present centralized timing control systems is their inefficient use of computer power. Since the central command computer must be intimately involved in the real-time control of the instruments and in dispatching data, the central computer remains in an unproductive waiting mode during a large segment of the operation.

The problem of providing a reliable and efficient measurement control system that avoids the shortcomings recited above has presented a major challenge to designers in the field of computer operated instrumentation systems. The development of a method and an apparatus that is flexible, easy to upgrade, allows for the addition of new instruments to an old network, and which better utilizes the resources of a control computer would constitute a major technological advance in the instrumentation business. The enhanced performance that could be achieved using such an innovative device would satisfy a long felt need within the industry and would enable both manufacturers and users of complex measurement devices to save substantial expenditures of time and money.

SUMMARY OF THE INVENTION

The Measurement System Control methods and apparatus which are disclosed and claimed in this patent application overcome the problems of inefficiency, programming difficulty, and hardware configuration constraints that are encountered when central control computers are employed to regulate instrumentation systems using interrupts or messages. The enhanced performance that is achieved using the present invention is due to the placement of a real-time synchronized clock and a data buffer on each instrument or device in the system that performs a measurement, provides a stimulus, controls some device, manages data, or performs a test. Instead of employing a central computer to provide centralized timing control commands to each instrument, instructions transmitted from a coordinating computer are stored on-board each instrument in a data buffer and operations based upon these instructions are executed when the instrument receives activation signals from a local real-time clock. This method and apparatus greatly enhance the flexibility and productivity of the system. Since the coordinating computer does not depend upon a centralized list of software instructions that are issued in a particular sequence to achieve timing control, the software code, language, and hardware may be upgraded or modified with little difficulty. Additional instruments may be added to a network of existing instruments easily, since there is no central timing scheme that would be disturbed by this expansion of system elements. The efficiency of the coordinating computer system is far greater in comparison to a control computer that handles each process step using interrupts or message passing, because the instruments function autonomously, without need for direct control. The present invention also solves the problem of the confusion of instrument output signals by associating a reference time supplied by the real-time clock with each group of instrument output data. In effect, this feature provides a time stamp for each piece of information produced by the system so that the order of information that describes the device or object under test is never in doubt, despite propagation delays or sequence changes that may be inherent in the network or in other systems, components, or software. This time stamp facility also enables an instrument to collect and to mark data without requiring pre-programming that would instruct the instrument about which data should be retained. The marked data can be selected at a later time based upon the time stamps and upon the interpretation of a message containing a reference time stamp, such as the time of some event which is external to the instrument.

Unlike a central computer which initiates and manages each operation of an instrument which it controls, the coordinating computer issues instructions based upon a program stored in its memory. Each such instruction is stored within an instrument in a data buffer. The instruction generally includes two components: a description of an operation that must be performed, and a specified time for its performance. A real-time clock supplies the instrument with the correct time so that it can execute its instructions from the coordinator on schedule. When the real time clock informs the instrument that an appropriate event time has been realized, the instrument will be activated and will perform the measurement or action dictated by the instructions which reside in its data buffer. After the measurement is made and an output signal from a device under test is collected by the instrument, the real-time clock supplies a reference time signal which is associated with each output signal or group of data derived from the device under test. By matching data with reference times and storing the data in an on-board buffer, the results of the measurement are preserved in their proper order and may be transferred to the coordinating computer or to some other device at some more convenient future time.

The Measurement System Control invention is an innovative method and apparatus that provides an effective and powerful tool which will enable engineers in the electronics industry to construct complex instrumentation networks that are more productive and flexible than currently available systems.

An appreciation of other aims and objectives of the present invention and a more complete and comprehensive understanding of this invention may be achieved by studying the following description of a preferred embodiment and by referring to the accompanying drawings.

DETAILED DESCRIPTION OF A PREFERRED EMBODIMENT

Figure 1:
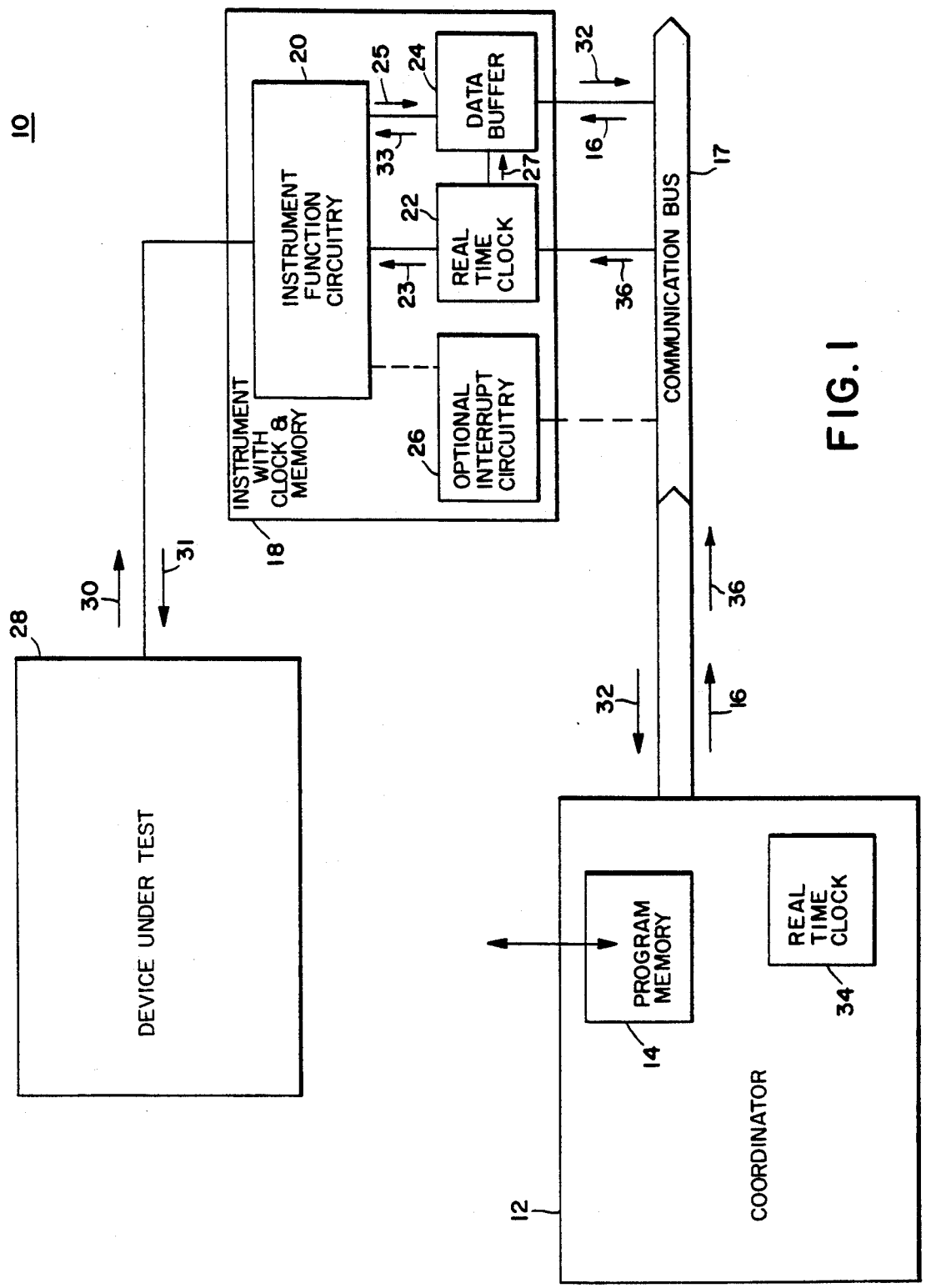
FIG. 1 is a block diagram of the apparatus which is used to implement Measurement System Control Using Real-Time Clocks and Data Buffers.

FIG. 1 is a schematic block diagram which depicts a Measurement System Controller 10. The system includes a coordinator 12 that transmits instruction signals 16 based upon a program stored in a memory 14 to an instrument 18 through a communication bus 17. The coordinator 12 is generally a computer which is able to issue a set of instructions, but the term "coordinator" is employed here as a generic term that encompasses any device which is capable of storing or generating instructions and disseminating them into a network. The term "set of instructions" refers to any number of commands, including one. The instrument 18 is coupled to the communication bus 17. The instrument 18 is shown as a single unit that includes function circuitry 20, a real-time synchronized clock 22, a data buffer 24, and optional interrupt circuitry 26. Instrument 18 is also coupled to a device under test 28. In this application, the term "device under test" refers to any apparatus, object, or environment about which an instrument gathers information, makes measurements, or provides a stimulus. Signals 30 and 31 passing between the device under test 28 and the instrument 18 are processed by function circuitry 20. The coordinator 12 will generally contain a real-time clock 34 so that the coordinator 12 can synchronize its internal operation with the remainder of the system and can generate instructions for the instrument 18.

Unlike a central computer which initiates and manages each operation of an instrument which it controls, the coordinator 12 issues instructions based upon a program stored in its memory 14 in the form of a signal 16. This instruction signal 16 propagates along the communication bus 17 and is stored within instrument 18 in data buffer 24. This input is read by the function circuitry 20 as a signal 33 that emanates from data buffer 24. The instruction signal 16 generally includes two components: a description of an operation that must be performed, and a specified time for its performance. For example, the gist of one typical instruction signal 16 might be: Measure the voltage present at the output of the device under test at 10:00 a.m. The real-time clock 22 supplies the instrument 18 with the correct time so that it can execute its stored copy of instructions 16 from the coordinator 12 on schedule. When the real time clock 22 informs the instrument 18 that the time is 10:00 a.m., the instrument 18 will be activated and will perform the measurement dictated by the instruction signals 16 which reside in its data buffer 24. The input of the correct time from the real-time clock 22 to the function circuitry 20 of the instrument 18 can be thought of as an activation time signal 23 which provides the timing control that would otherwise be accomplished by the optional interrupt circuitry 26 acting on particular interrupt commands or messages from a central computer. After the measurement is made and a parameter or an output signal 30 from the device under test 28 is collected by the instrument 18, the real-time clock 22 supplies a reference time signal 27 which is associated with each output signal 30 or group of data derived from the device under test 28. The data buffer 24 stores each group of data 30 with its associated reference time signal 27 until the coordinator 12 calls for the instrument 18 to dispatch the results of the measurement 30 or stimulus 31 back along the communication bus 17 in the form of an instrument output signal 32. If the instrument 18 provides a stimulus 31 to the device under test 28, the stimulus appears as an input signal 31 in accordance with the instruction signal 16 which has been stored in data buffer 24. The stimulus 31 is triggered by a timing signal 23 from the real-time clock 22.

Figure 2:
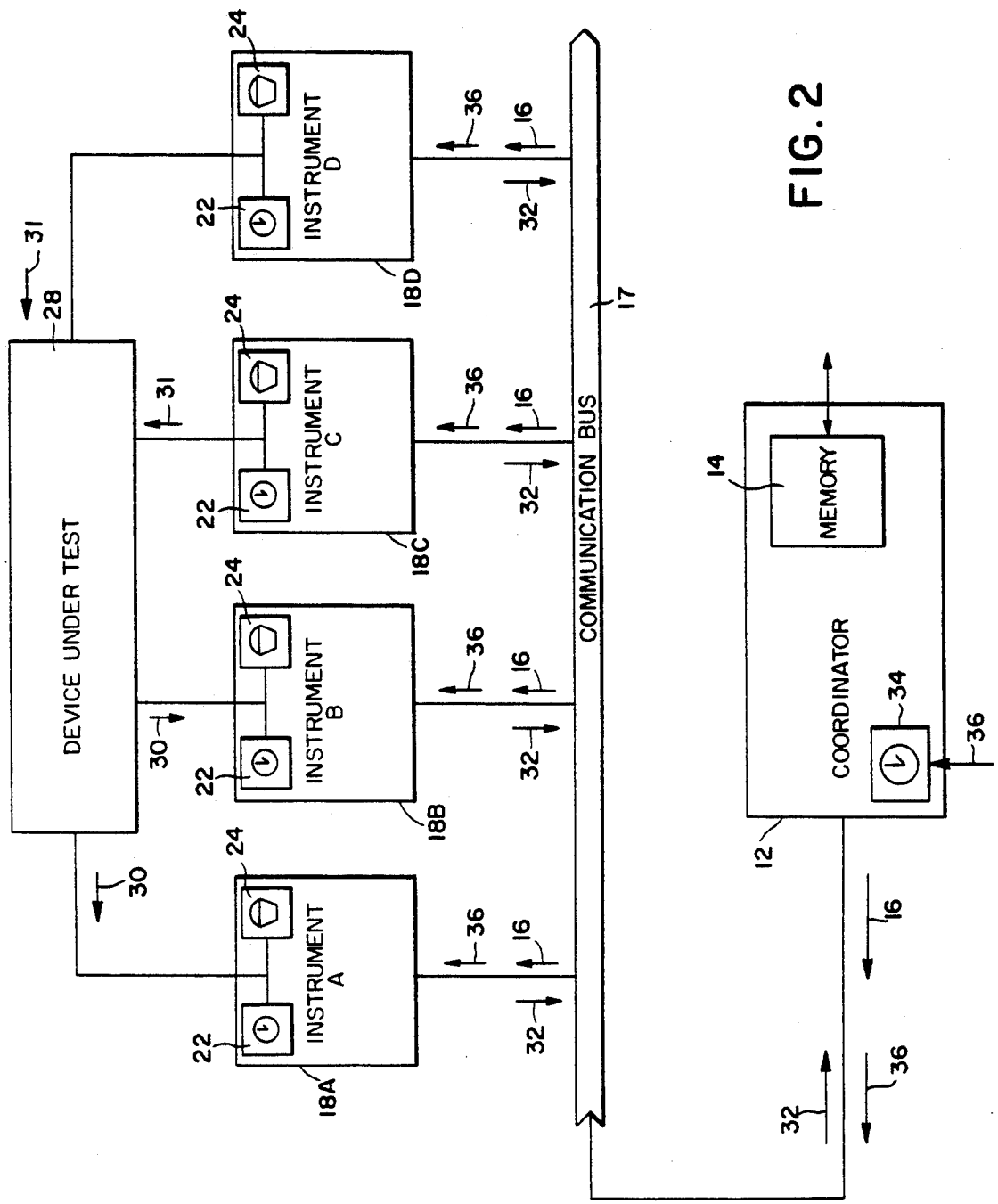
FIG. 2 is a block diagram of various instruments that are coordinated in accordance with the inventor's method.

FIG. 2 expands upon the arrangement shown in FIG. 1 to show the same relative configuration for the case of multiple instruments. Some of the components illustrated in FIG. 2 are similar to components shown in FIG. 1, and for convenience such components have been assigned the same reference numerals as the corresponding components in FIG. 1. In FIG. 2, four instruments 18A, 18B, 18C and 18D are each regulated by coordinator 12. 18A and 18B represent instruments which perform measurements, while 18C and 18D represent instruments that supply stimuli to a device 28 under test. Any number of instruments such as the instruments 18A through 18D may be coordinated using the method and apparatus of the present invention that is disclosed and claimed in this patent application.

One great advantage provided by using real-time clocks 22 is the avoidance of transmission delays that might otherwise disrupt a system that is connected across a network. If a central computer is employed to provide timing control by sending interrupt signals to instruments, the transmission delays cause skew in the event synchronization which can compromise the significance of the measurements 30 and stimuli 31. When real-time synchronized clocks associated with each instrument are used to regulate the scheduling of the system, the skew is a function of clock synchronization rather than any variation in the transmission media. This skew is easier to calibrate and can be limited by maintaining a highly accurate synchronization among all the clocks in the system.

The real-time clocks 22 must be sufficiently precise and stable to provide reliable timing control. Commonly available devices easily achieve stabilities of one part in a billion. This rate accuracy is adequate to maintain two 1 MHz systems in synchronization to an accuracy of one microsecond for a period of approximately ten minutes. The degree of difficulty encountered in synchronizing the clocks depends upon the accuracy requirements and the nature of the transmission media that is employed. Techniques for synchronizing clocks using an external timing signal 36 are described in the literature. These techniques generally involve the exchange of messages containing the local time of the sender among the various clocks of the system. Persons ordinarily skilled in the art are capable of using these messages and the algorithms to synchronize clocks to a degree of accuracy that is required to practice the present invention.

The incorporation of a data buffer 24 on each instrument 18 allows the coordinator 12 to retrieve the results of a measurement 32 that are stored in the buffer 24 at a time which may be much later than the time at which the measurement was actually made. This technique enables the user of the system to "reach back in time" and observe measurements that were made previously. The method is limited only by the storage capacity of the data buffer 24 and by the required time resolution between reference time values 27 that are associated with each group of data 30 or 31 collected by the instrument 18. The data buffer 24 may be partitioned in many ways, including, but not limited to, separate sections for instruction signals 16 and output signals 32. The buffer 24 may also be partitioned on the basis of time periods established by the real-time clock 22 via signal 27. A third alternative would be to partition the buffer 24 into sections for static and dynamically changing data.

Another beneficial consequence of implementing the methods prescribed by the present invention is that the choice of the communication bus 17 is far less critical than in the case of using a central computer transmitting interrupts or messages to accomplish timing control. With some minor modifications, the present invention may be practiced on a GP-IB Network, Local Area Network, or other similar communication media.

The present invention may also be utilized when the measurement process must be initiated by some external event that can not be scheduled in advance. This is accomplished by transmitting a control signal to all system resources. This control signal would be generated by the instrument that detects the external event. This signal would contain the time of the external event as established by a real-time clock. When another instrument receives this time value imbedded in the control signal, the received time value is compared to the time indicated by the real-time clock on-board the receiving instrument. The appropriate operations or procedures are then executed in accordance with the instructions held in a data buffer on the receiving instrument.

Measurement System Control Using Real-Time Clocks and Data Buffers provides an accurate and powerful improvement for a wide variety of instrumentation systems. This invention constitutes a major step forward in the continually evolving field of electronic test and measurement.

Although the present invention has been described in detail with reference to a particular preferred embodiment, persons possessing ordinary skill in the art to which this invention pertains will appreciate that various modifications and enhancements may be made without departing from the spirit and scope of the claims that follow.

LIST OF REFERENCE NUMERALS

10: Measurement System Controller
12: Coordinator
14: Program memory
16: Instruction signals
17: Communication bus
18: Instrument with real-time clock and data buffer
20: Instrument function circuitry
22: Real-time clock
23: Activation time signal
24: Data buffer
25: Instrument output data
26: Optional interrupt circuitry
27: Reference time signal
28: Device under test
30: Output signal from device under test
31: Stimulus signal to device under test
32: Instrument output signal
33: Instrument instructions and stimulus data
34: Real-time clock
36: External timing signal

What is claimed is:

1. A method of controlling measurement instruments in a system having a coordination means that transmits control instructions to different ones of a plurality of remotely-located measurement instruments which are responsive to control instructions to perform measurements and transmit results of those measurements back to the coordination means, the method comprising:

transmitting from the coordination means to a first one of the measurement instruments a control instruction that specifies a measurement to be performed and a predetermined finite time after occurrence of a predefined event at which the measurement is to be performed;

storing the control instruction in a local buffer in the first measurement instrument;

detecting the time of occurrence of the specified event by means of a local clock in a second measurement instrument;

transmitting said time of occurrence to the first measurement instrument;

determining by reference to a local clock in the first measurement instrument that the time at which the measurement is to be performed is at hand;

performing the measurement when said time to perform the measurement is at hand; and storing the result of the measurement and the time at which the measurement was taken in the local buffer in the first measurement instrument.

2. A method as in claim 1 and further comprising synchronizing the local clocks in the first and second instruments with each other.

3. A method as in claim 1 wherein detecting the time of occurrence of the specified event comprises detecting the time at which a parameter reaches a specified value.

4. A method as in claim 1 and further comprising:

sending to the first instrument a request from the coordination means for the stored result and time of measurement; and responsive to said request, retrieving the stored result and time of measurement from the local buffer of the first measurement instrument and transmitting them to the coordination means.

5. A method as in claim 1 wherein detecting occurrence of the specified event comprises:

transmitting from the coordination means to the second measurement instrument a second control instruction that requires the second instrument to note the time at which the predefined event occurs and to inform the first instrument of that time; and storing the second control instruction in a local buffer in the second measurement instrument.

* * * * *